United States Patent
Wei et al.

(10) Patent No.: US 9,806,058 B2
(45) Date of Patent: Oct. 31, 2017

(54) CHIP PACKAGE HAVING DIE STRUCTURES OF DIFFERENT HEIGHTS AND METHOD OF FORMING SAME

(71) Applicant: TAIWAN SEMICONDUCTOR MANUFACTURING CO., LTD., Hsinchu (TW)

(72) Inventors: Wen-Hsin Wei, Hsinchu (TW); Chi-Hsi Wu, Hsinchu (TW); Chen-Hua Yu, Hsinchu (TW); Hsien-Pin Hu, Zhubei (TW); Shang-Yun Hou, Zhubei (TW); Wei-Ming Chen, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/003,150

(22) Filed: Jan. 21, 2016

(65) Prior Publication Data
US 2017/0005072 A1    Jan. 5, 2017

Related U.S. Application Data

(60) Provisional application No. 62/188,169, filed on Jul. 2, 2015.

(51) Int. Cl.
*H01L 23/31* (2006.01)
*H01L 23/00* (2006.01)
(Continued)

(52) U.S. Cl.
CPC ...... *H01L 25/0652* (2013.01); *H01L 23/5384* (2013.01); *H01L 24/03* (2013.01); *H01L 24/09* (2013.01); *H01L 24/96* (2013.01); *H01L 25/18* (2013.01); *H01L 25/50* (2013.01); *H01L 21/568* (2013.01); *H01L 23/3128* (2013.01); *H01L 2224/04105* (2013.01);
(Continued)

(58) Field of Classification Search
CPC ..... H01L 25/50; H01L 25/0657; H01L 24/81; H01L 21/565; H01L 21/78; H01L 24/11; H01L 23/31; H01L 23/522; H01L 25/516; H01L 25/00; H01L 23/00; H01L 23/3157; H01L 24/09; H01L 23/5226; H01L 24/32; H01L 24/17; H01L 24/83; H01L 24/89; H01L 24/50
USPC ....... 257/773, 774, 686, 685, 723, 728, 777, 257/784, 786, 787, 788
See application file for complete search history.

(56) References Cited

U.S. PATENT DOCUMENTS 6,549,821 B1 * 4/2003 Farnworth .......... B29C 67/0066
                                                                264/163
6,624,005 B1 * 9/2003 DiCaprio .............. H01L 21/561
                                                                257/E21.705

(Continued)

FOREIGN PATENT DOCUMENTS

TW    201523827 A    6/2015

*Primary Examiner* — Alexander Oscar Williams
(74) *Attorney, Agent, or Firm* — Slater Matsil, LLP

(57) ABSTRACT

Structures and formation methods of a chip package are provided. The chip package includes a chip stack including a number of semiconductor dies. The chip package also includes a semiconductor chip, and the semiconductor chip is higher than the chip stack. The chip package further includes a package layer covering a top and sidewalls of the chip stack and sidewalls of the semiconductor chip.

20 Claims, 14 Drawing Sheets

(51) Int. Cl.
  *H01L 25/00* (2006.01)
  *H01L 23/538* (2006.01)
  *H01L 25/065* (2006.01)
  *H01L 25/18* (2006.01)
  *H01L 21/56* (2006.01)

(52) U.S. Cl.
  CPC ............... *H01L 2224/06181* (2013.01); *H01L 2224/08235* (2013.01); *H01L 2224/12105* (2013.01); *H01L 2224/16227* (2013.01); *H01L 2224/16235* (2013.01); *H01L 2224/17181* (2013.01); *H01L 2224/32225* (2013.01); *H01L 2224/73204* (2013.01); *H01L 2224/73259* (2013.01); *H01L 2225/06513* (2013.01); *H01L 2225/06517* (2013.01); *H01L 2225/06541* (2013.01); *H01L 2924/1436* (2013.01); *H01L 2924/1437* (2013.01); *H01L 2924/15311* (2013.01); *H01L 2924/182* (2013.01); *H01L 2924/18161* (2013.01)

(56) References Cited

U.S. PATENT DOCUMENTS

| | | | |
|---|---|---|---|
| 7,923,828 B2 * | 4/2011 | Endo | H01L 21/4857 257/678 |
| 8,552,567 B2 | 10/2013 | England et al. | |
| 9,305,809 B1 * | 4/2016 | Espiritu | H01L 21/486 |
| 2004/0245674 A1 * | 12/2004 | Yew | H05K 3/284 264/272.17 |
| 2013/0049221 A1 * | 2/2013 | Han | H01L 21/561 257/774 |
| 2013/0075881 A1 * | 3/2013 | Huang | H01L 23/49503 257/670 |
| 2013/0099368 A1 * | 4/2013 | Han | H01L 23/473 257/692 |
| 2013/0176746 A1 * | 7/2013 | Nishimura | H05K 1/189 362/382 |
| 2014/0185248 A1 * | 7/2014 | Mizushiro | H01L 25/04 361/728 |
| 2014/0346671 A1 * | 11/2014 | Yu | H01L 23/481 257/737 |
| 2016/0013172 A1 * | 1/2016 | Lin | H01L 25/50 438/108 |
| 2016/0064365 A1 * | 3/2016 | Jang | H01L 25/0652 257/777 |
| 2016/0099218 A1 * | 4/2016 | Lee | H01L 24/97 438/113 |
| 2016/0343635 A1 * | 11/2016 | Rae | H01L 23/3157 |
| 2017/0162542 A1 * | 6/2017 | Chen | H01L 25/0655 |

* cited by examiner

CHIP PACKAGE HAVING DIE STRUCTURES OF DIFFERENT HEIGHTS AND METHOD OF FORMING SAME

PRIORITY CLAIM AND CROSS-REFERENCE

This Application claims the benefit of U.S. Provisional Application No. 62/188,169, filed on Jul. 2, 2015, the entirety of which is incorporated by reference herein.

BACKGROUND

Semiconductor devices are used in a variety of electronic applications, such as personal computers, cell phones, digital cameras, and other electronic equipment. These semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allow more components to be integrated into a given area. These smaller electronic components also use a smaller package that utilizes less area or a smaller height, in some applications.

New packaging technologies have been developed to improve the density and functions of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
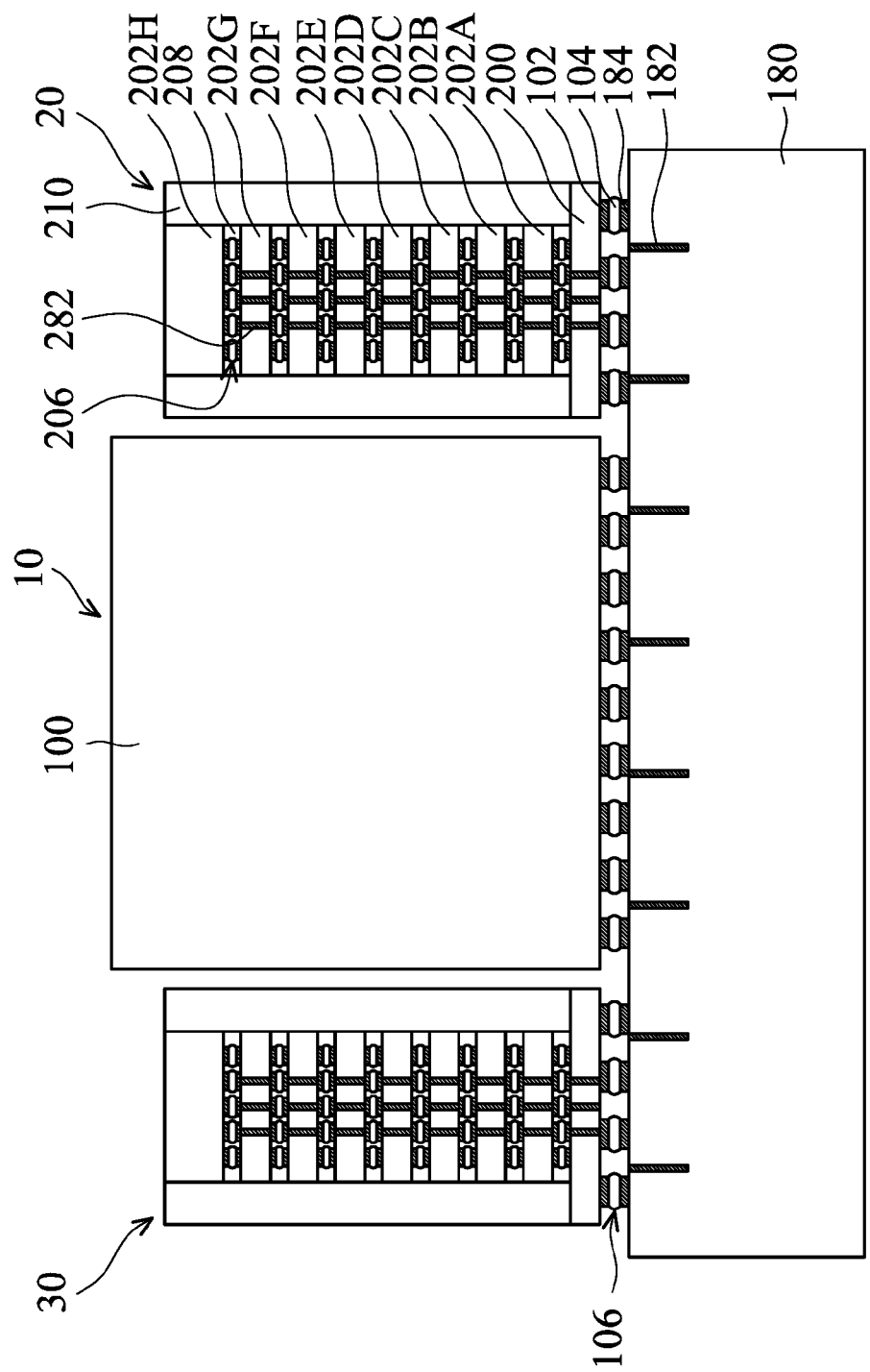
FIGS. 1A-1F are cross-sectional views of various stages of a process for forming a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1F are cross-sectional views of various stages of a process for forming a chip package, in accordance with some embodiments. Additional operations can be provided before, during, and/or after the stages described in FIGS. 1A-1F. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As shown in FIG. 1A, a semiconductor chip 10 and chip stacks 20 and 30 are bonded over a substrate 180, in accordance with some embodiments. In some embodiments, the semiconductor chip 10 is higher than the chip stack 20 or 30. In some embodiments, the semiconductor chip 10 includes a semiconductor substrate 100 and an interconnection structure (not shown) formed on the semiconductor substrate 100. For example, the interconnection structure is formed on a bottom surface of the semiconductor substrate 100. The interconnection structure includes multiple interlayer dielectric layers and multiple conductive features formed in the interlayer dielectric layers. These conductive features include conductive lines, conductive vias, and conductive contacts. Some portions of the conductive features may be used as conductive pads.

In some embodiments, various device elements are formed in the semiconductor substrate 100. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements.

The device elements are interconnected through the interconnection structure to form integrated circuit devices. The integrated circuit devices include logic devices, memory devices (e.g., static random access memories, SRAMs), radio frequency (RF) devices, input/output (I/O) devices, system-on-chip (SoC) devices, other applicable types of devices, or a combination thereof. In some embodiments, the semiconductor chip 10 is a system-on-chip (SoC) chip that includes multiple functions.

In some embodiments, each of the chip stacks 20 and 30 includes multiple semiconductor dies that are stacked. As shown in FIG. 1A, the chip stack 20 includes semiconductor dies 200, 202A, 202B, 202C, 202D, 202E, 202F, 202G, and 202H. In some embodiments, the chip stack 20 includes a molding compound layer 210 that encapsulates and protects these semiconductor dies. The molding compound layer 210 may include an epoxy-based resin with fillers dispersed therein. The fillers may include insulating fibers, insulating particles, other suitable elements, or a combination thereof.

In some embodiments, the semiconductor dies 202A, 202B, 202C, 202D, 202E, 202F, 202G, and 202H are memory dies. The memory dies may include memory devices such as static random access memory (SRAM) devices, dynamic random access memory (DRAM) devices, other suitable devices, or a combination thereof. In some embodiments, the semiconductor die 200 is a control die that is electrically connected to the memory dies stacked thereon. The chip stack 20 may function as a high bandwidth memory (HBM). In some embodiments, the chip stack 30 is also a high bandwidth memory that includes multiple stacked memory dies.

Many variations and/or modifications can be made to embodiments of the disclosure. In some embodiments, one of the chip stacks 20 and 30 includes only a single chip. In these cases, the reference number 20 or 30 can be used to designate a semiconductor chip.

In some embodiments, conductive bonding structures 206 are formed between these semiconductor dies 200, 202A, 202B, 202C, 202D, 202E, 202F, 202G, and 202H to bond them together, as shown in FIG. 1A. In some embodiments, each of the conductive bonding structures 206 includes metal pillars and/or solder bumps. In some embodiments, underfill elements 208 are formed between these semiconductor dies to surround and protect the conductive bonding structures 206. In some embodiments, the underfill element 208 includes an epoxy-based resin with fillers dispersed therein. The fillers may include insulating fibers, insulating particles, other suitable elements, or a combination thereof. In some embodiments, the size and/or density of the fillers dispersed in the underfill element 208 is smaller than those dispersed in the molding compound layer 210.

In some embodiments, multiple conductive features 282 are formed in some of the semiconductor dies in the chip stack 20, as shown in FIG. 1A. Each of the conductive features 282 penetrates through one of the semiconductor dies 200, 202A, 202B, 202C, 202D, 202E, 202F, 202G, and 202H and is electrically connected to one of the conductive bonding structures 206. The conductive features 282 are used as through substrate vias (TSVs). Electrical signals can be transmitted between these vertically stacked semiconductor dies through the conductive features 282.

As shown in FIG. 1A, the semiconductor chip 10 and the chip stacks 20 and 30 are bonded onto the substrate 180 through conductive bonding structures 106, in accordance with some embodiments. In some embodiments, the conductive bonding structures 106 include solder bumps, metal pillar bumps, other suitable structures, or a combination thereof. In some embodiments, each of the conductive bonding structures 106 includes a metal pillar bump 102, a solder element 104, and a metal pillar bump 184, as shown in FIG. 1A. For example, the metal pillar bumps 102 and 184 are substantially made of copper.

In some embodiments, a number of metal pillar bumps 102 are formed over the bottom surfaces of the semiconductor chip 10 and the chip stacks 20 and 30. In some embodiments, a number of metal pillar bumps 184 are formed over the substrate 180 before the bonding with the semiconductor chip 10 and the chip stacks 20 and 30.

In some embodiments, solder material, such as solder paste, is applied on one or both of the metal pillar bumps 102 and 184 before the bonding process. Afterwards, the metal pillar bumps 102 and 184 are bonded together through the solder material. The solder material forms the solder elements 104 between the metal pillar bumps 102 and 184. As a result, the conductive bonding structures 106 are formed, as shown in FIG. 1A. In some embodiments, the solder material is an alloy material that includes tin (Sn). The solder material also includes another element. The element may include lead, silver, copper, nickel, bismuth, another suitable element, or a combination thereof. In some embodiments, the solder material does not include lead.

In some embodiments, the substrate 180 includes a semiconductor material, a ceramic material, an insulating material, a polymer material, another suitable material, or a combination thereof. In some embodiments, the substrate 180 is a semiconductor substrate. The semiconductor substrate may be a semiconductor wafer, such as a silicon wafer.

As shown in FIG. 1A, a number of conductive features 182 are formed in the substrate 180, in accordance with some embodiments. In some embodiments, the conductive features 182 are formed before the formation of the metal pillar bumps 184. In some embodiments, each of the conductive features 182 is electrically connected to one of the metal pillar bumps 184. Interconnection structures (not shown) including, for example, redistribution layers may be used to form electrical connections between the conductive features 182 and the metal pillar bumps 184. In some embodiments, insulating elements (not shown) are formed between the conductive features 182 and the substrate 180 to prevent short circuiting between different conductive features 182.

In some embodiments, the conductive features 182 are made of copper, aluminum, titanium, tungsten, cobalt, gold, platinum, another suitable material, or a combination thereof. In some embodiments, the insulating elements are made of silicon oxide, silicon nitride, silicon oxynitride, silicon carbide, another suitable material, or a combination thereof. In some embodiments, one or more photolithography and etching processes are used to form a number of openings that define the positions of the conductive features 182. Afterwards, an insulating layer and a conductive layer are sequentially deposited over the substrate 180 to fill the openings. A planarization process is then performed to remove the portions of the insulating layer and the conductive layer outside of the openings. As a result, the remaining portions of the insulating layer and the conductive layer in the openings form the insulating elements and the conductive features 182, respectively.

Figure 1B:
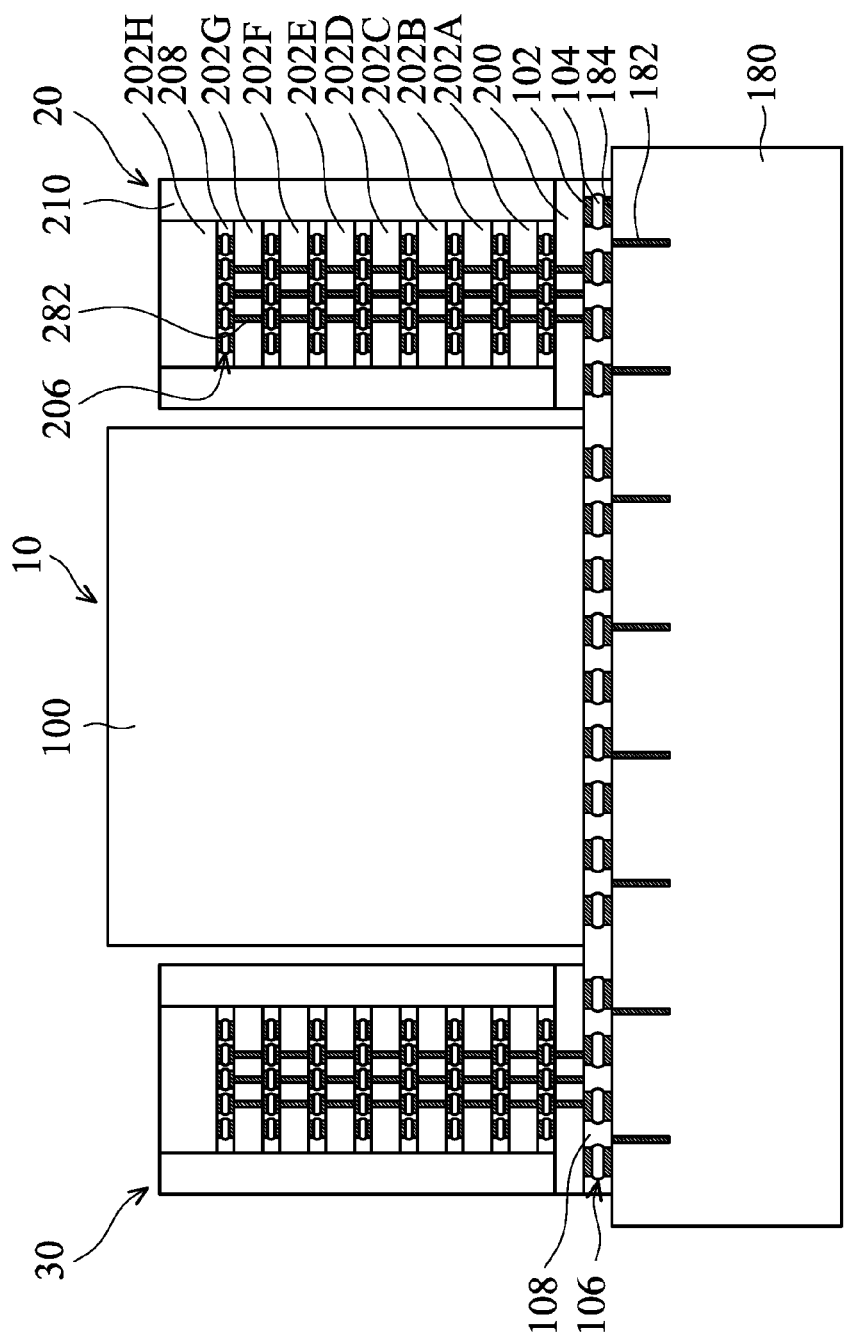

As shown in FIG. 1B, an underfill layer 108 is formed to surround and protect the conductive bonding structures 106, in accordance with some embodiments. In some embodiments, the underfill layer 108 is in direct contact with the conductive bonding structures 106. In some embodiments, a liquid underfill material is dispensed by capillary action and cured to form the underfill layer 108. In some embodiments, the underfill layer 108 includes an epoxy-based resin with fillers dispersed therein. The fillers may include fibers, particles, other suitable elements, or a combination thereof.

Figure 1C:
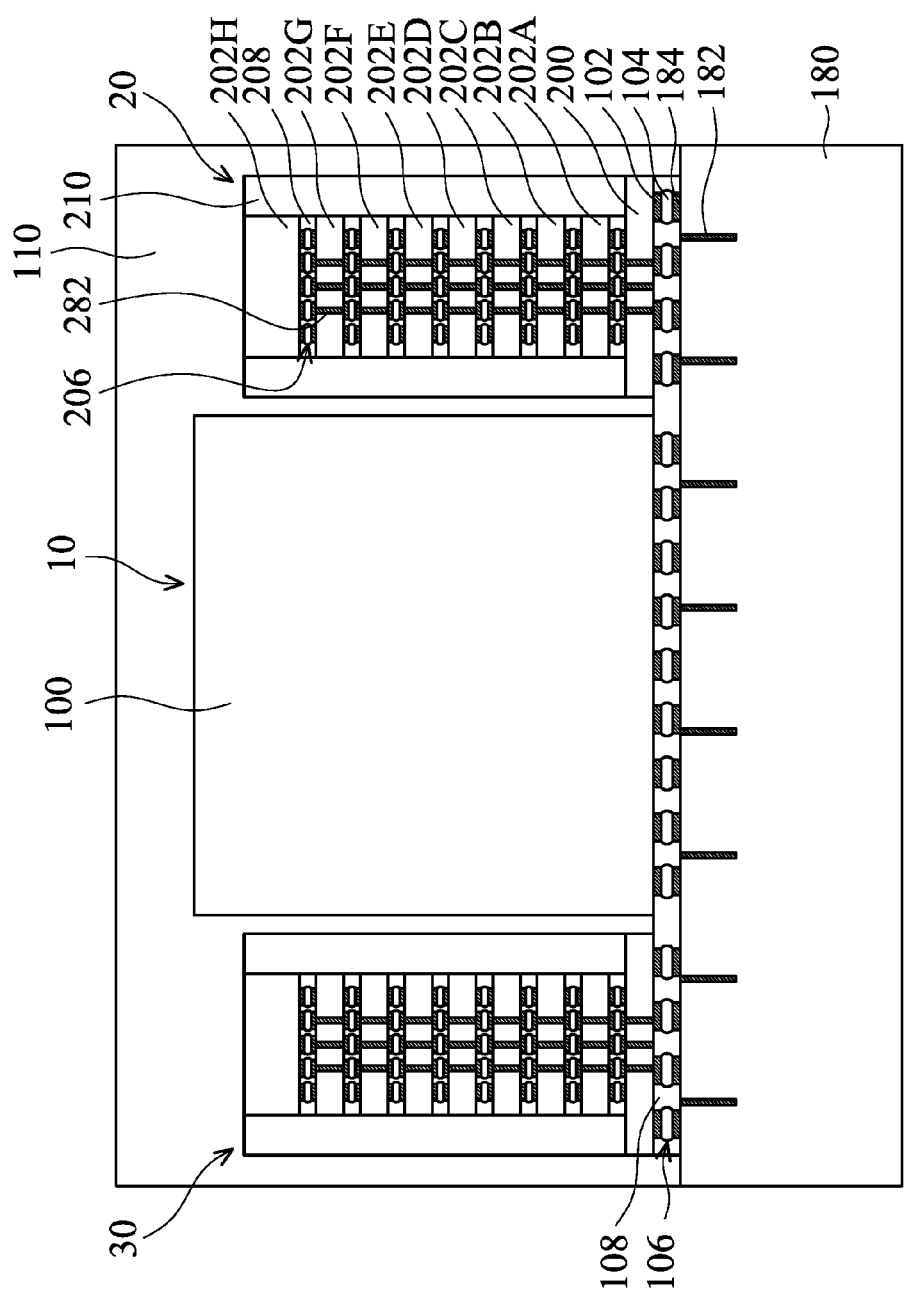

As shown in FIG. 1C, a package layer 110 is formed over the substrate 180 to encapsulate the semiconductor chip 10 and the chip stacks 20 and 30, in accordance with some embodiments. In some embodiments, the package layer 110 fills gaps between the semiconductor chip 10 and the chip stack 20 or 30. In some embodiments, the package layer 110 is in direct contact with the underfill layer 108. In some embodiments, the package layer 110 is not in direct contact with the conductive bonding structures 106. In some embodiments, the package layer 110 is in direct contact with the molding compound layers 210 of the chip stacks 20 and 30.

In some embodiments, the package layer 110 includes a polymer material. In some embodiments, the package layer 110 is a molding compound layer. The molding compound layer may include an epoxy-based resin with fillers dispersed therein. The fillers may include insulating fibers, insulating particles, other suitable elements, or a combination thereof. In some embodiments, the size and/or density of the fillers dispersed in the package layer 110 is greater than those dispersed in the underfill layer 108.

In some embodiments, a liquid molding compound material is applied, and a thermal operation is then applied to cure the liquid molding compound material. As a result, the liquid molding compound material is hardened and transformed into the package layer 110. In some embodiments, the thermal operation is performed at a temperature in a range from about 200 degrees C. to about 230 degrees C. The operation time of the thermal operation may be in a range from about 1 hour to about 3 hours.

Figure 1D:
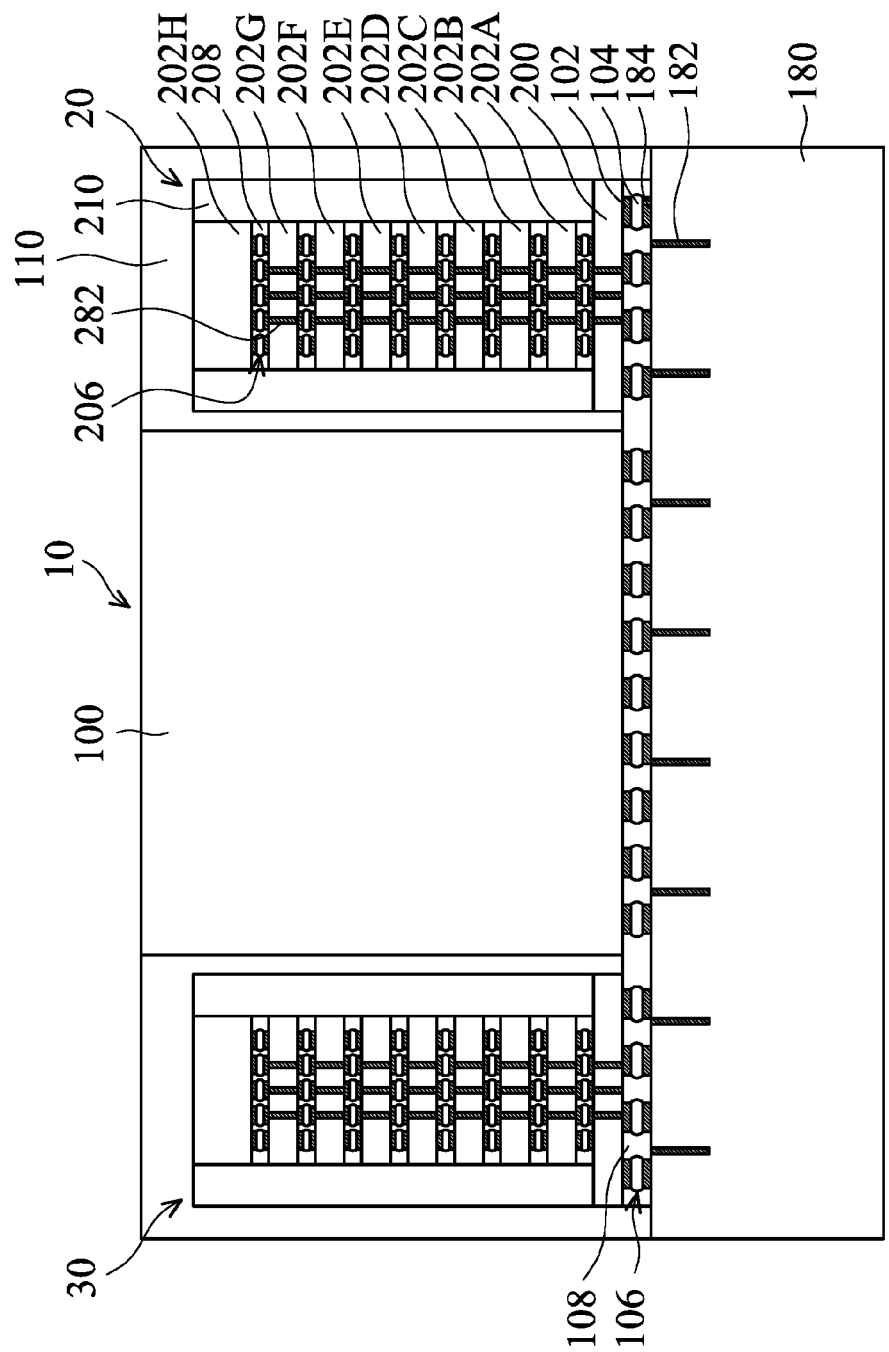

As shown in FIG. 1D, the package layer 110 is planarized such that the top surface of the semiconductor chip 10 is exposed, in accordance with some embodiments. In some embodiments, the top surfaces of the semiconductor chip 10 and the package layer 110 are substantially coplanar with each other. In some embodiments, the package layer 110 is planarized using a grinding process, a chemical mechanical polishing (CMP) process, another applicable process, or a combination thereof. In some embodiments, the top surface of the chip stack 20 or 30 remains covered by the package layer 110. In some embodiments, the chip stacks 20 and 30 are protected by the package layer 110 during the planarization process. The chip stacks 20 and 30 are not ground during the planarization process. Therefore, the chip stacks 20 and 30 are prevented from being damaged during the planarization process. The quality and reliability of the chip stacks 20 and 30 are significantly improved.

In some embodiments, the package layer 110 covers the top and the sidewalls of the chip stacks 20 and 30, as shown in FIG. 1D. In some embodiments, the top surface of the semiconductor chip 10 is not covered by the package layer 110. In some embodiments, the top surface of the package layer 110 is substantially coplanar with the top surface of the semiconductor chip 10, which may facilitate subsequent processes.

Figure 1E:
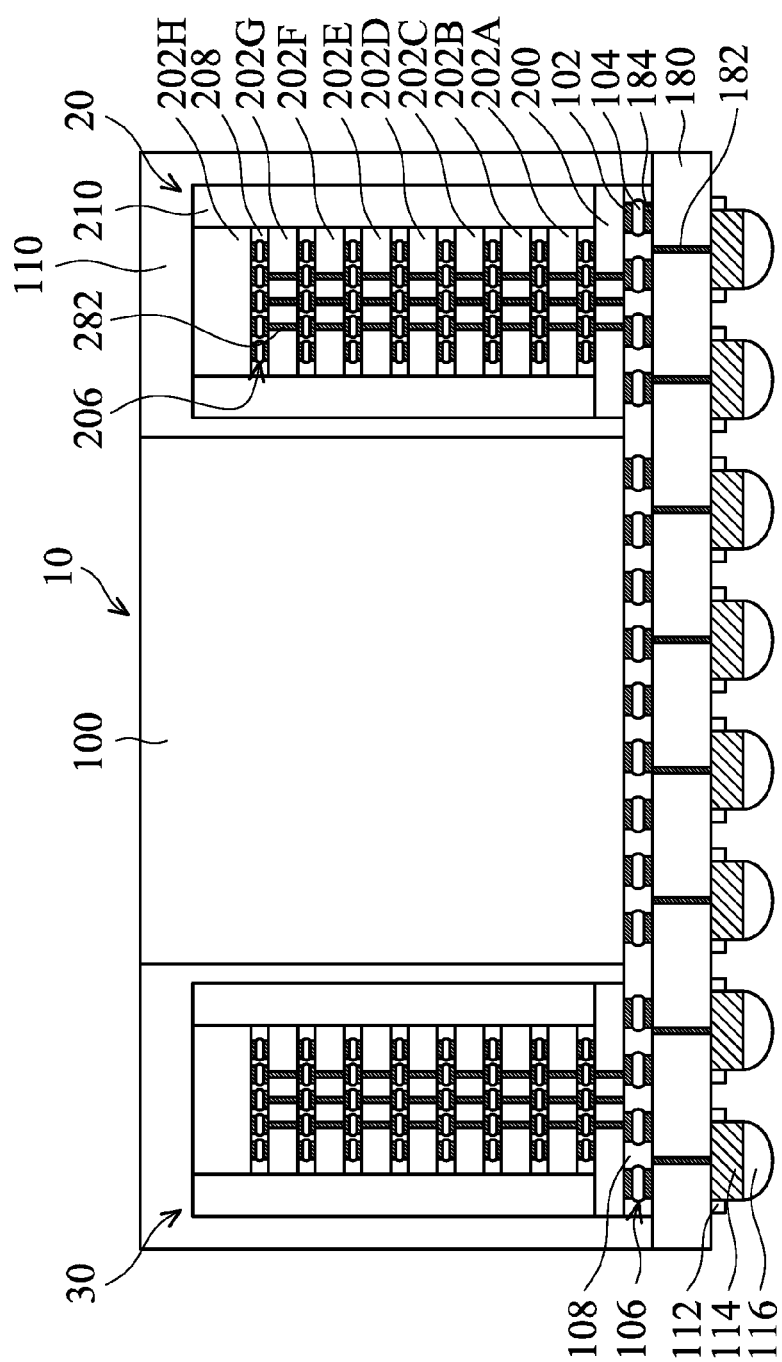

As shown in FIG. 1E, the substrate 180 is thinned to expose the conductive features 182, in accordance with some embodiments. In some embodiments, each of the conductive features 182 penetrates through the substrate 180. In some embodiments, each of the conductive features 182 is electrically connected to one of the conductive bonding structures 106. In some embodiments, the structure shown in FIG. 1D is turned upside down. Afterwards, the substrate 180 is thinned using a planarization process to expose the conductive features 182. The planarization process may include a CMP process, a grinding process, an etching process, another applicable process, or a combination thereof.

Afterwards, conductive elements are formed over the substrate 180, as shown in FIG. 1E in accordance with some embodiments. In some embodiments, the conductive elements include metal pillars 114 and solder elements 116, as shown in FIG. 1E. However, many variations and/or modifications can be made to embodiments of the disclosure. In some other embodiments, the conductive elements have different structures. For example, the conductive elements do not include metal pillars. The conductive elements may only include solder bumps. In some embodiments, a buffer layer 112 is formed to protect the conductive elements. In some embodiments, each of the metal pillars 114 is electrically connected to one of the conductive features 182. In some embodiments, the buffer layer 112 extends along portions of the sidewalls of the metal pillars 114, as shown in FIG. 1E. In some embodiments, the buffer layer 112 is made of silicon nitride, silicon oxynitride, silicon oxide, polyimide, epoxy resin, polybenzoxazole (PBO), another suitable material, or a combination thereof.

Figure 1F:
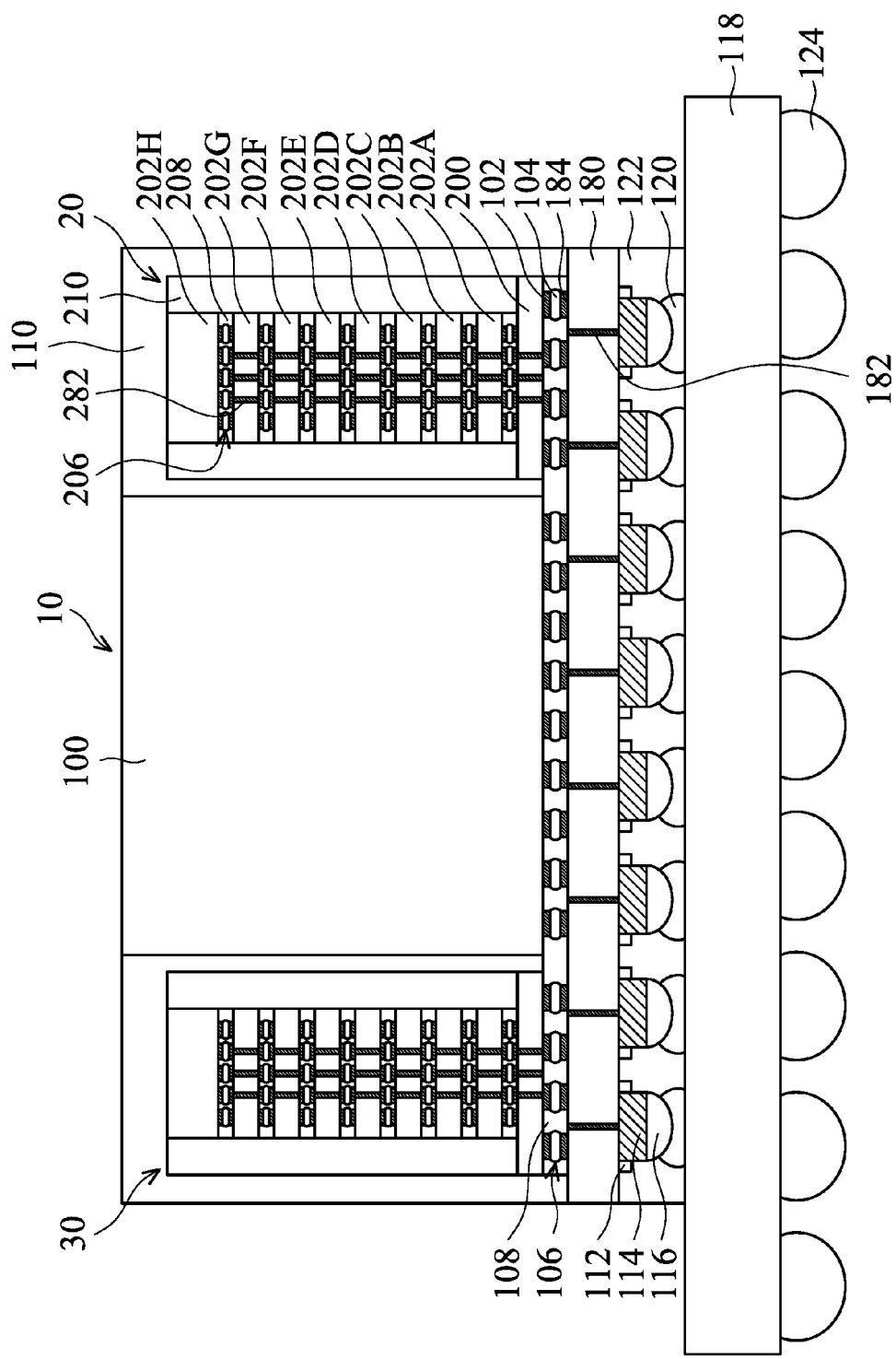

As shown in FIG. 1F, the structure shown in FIG. 1E is bonded onto a substrate 118, in accordance with some embodiments. In some embodiments, the substrate 118 is a circuit board such as a printed circuit board. In some other embodiments, the substrate 118 is a ceramic substrate. In some embodiments, conductive elements 120 and 124 are formed on opposite surfaces of the substrate 118, as shown in FIG. 1F. In some embodiments, the conductive elements 120 and 124 are solder bumps such as controlled collapse chip connection (C4) bumps and/or ball grid array (BGA) bumps. In some embodiments, the conductive elements 120 and the solder elements 116 are reflowed and bonded together, as shown in FIG. 1F.

In some embodiments, each of the conductive elements 120 is electrically connected to one of the conductive elements 124 through conductive features (not shown) formed in the substrate 118. The conductive features may include conductive lines and conductive vias. In some embodiments, an underfill layer 122 is then formed between the substrate 118 and the substrate 180 to protect the conductive bonding structures therebetween.

Figure 2:
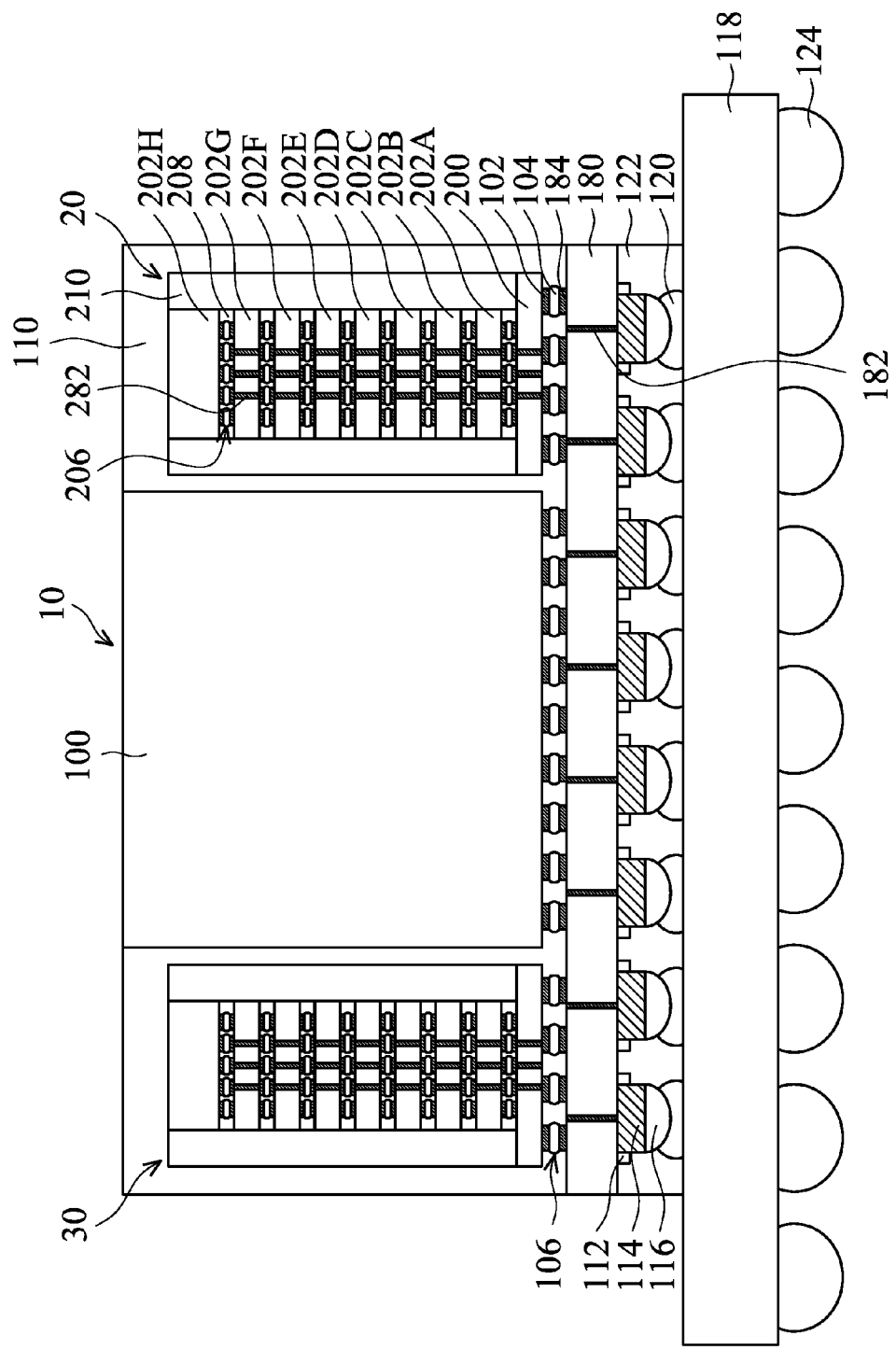
FIG. 2 is a cross-sectional view of a chip package, in accordance with some embodiments.

Many variations and/or modifications can be made to embodiments of the disclosure. FIG. 2 is a cross-sectional view of a chip package, in accordance with some embodiments. In some embodiments, the underfill layer 108 is not formed. In some embodiments, the package layer 110 fills the space between the substrate 180 and the semiconductor chips including the semiconductor chip 10 and the chip stacks 20 and 30. The package layer 110 surrounds the conductive bonding structures 106. In some embodiments, since the underfill layer 108 is not formed, the package layer 110 is in direct contact with the conductive bonding structures 106.

In some embodiments, the substrate 180 is used as an interposer. In some embodiments, the interposer does not include active devices therein. In some other embodiments, the interposer includes one or more active devices formed therein. In some embodiments, the substrate 180 is a silicon interposer. The substrate 180 may be used to improve the structural strength and reliability of the chip package. However, embodiments of the disclosure are not limited thereto. Many variations and/or modifications can be made to embodiments of the disclosure. In some embodiments, the substrate 180 is not formed.

Figure 3A:
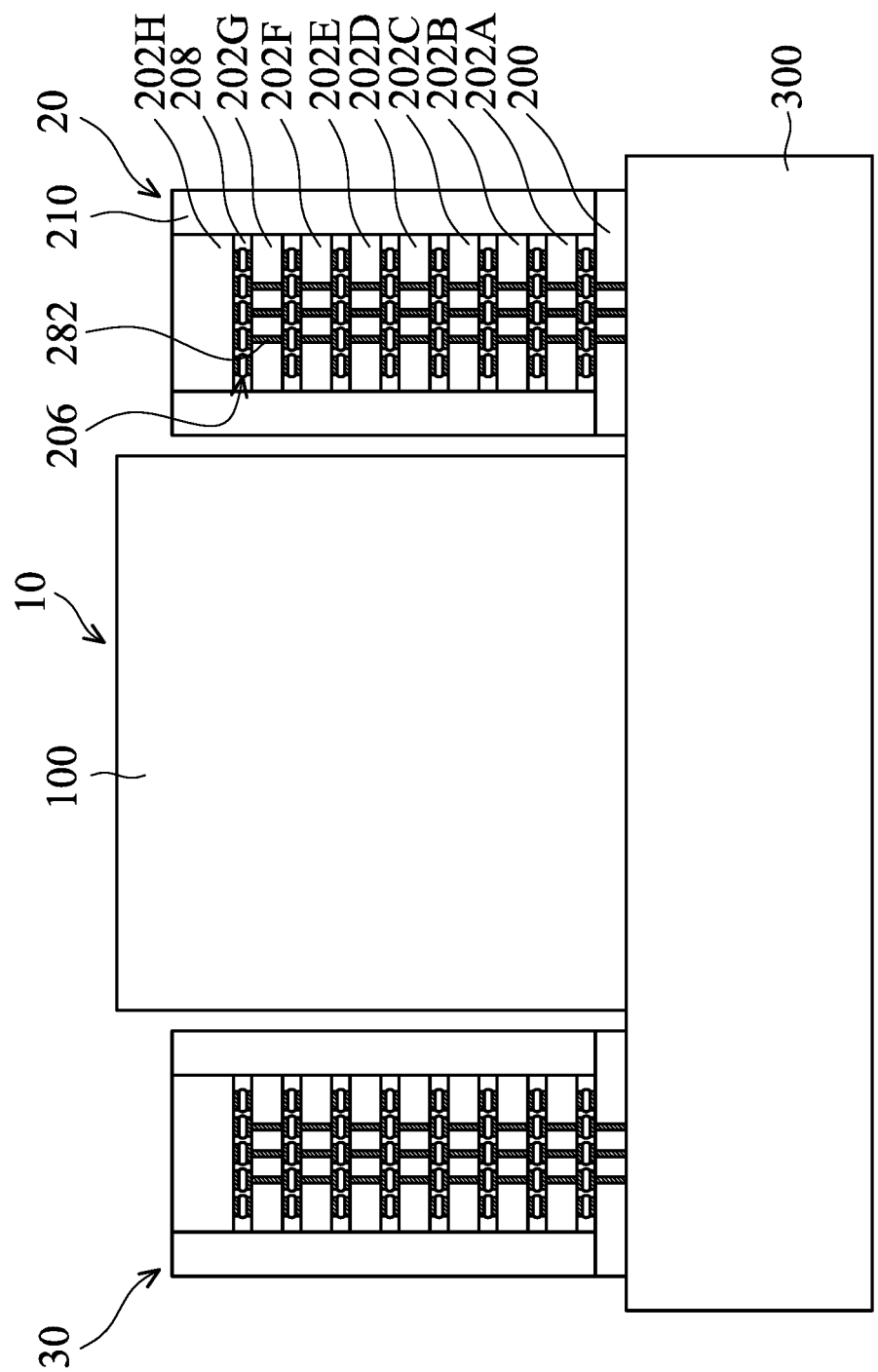
FIGS. 3A-3E are cross-sectional views of various stages of a process for forming a chip package, in accordance with some embodiments.

FIGS. 3A-3E are cross-sectional views of various stages of a process for forming a chip package, in accordance with some embodiments. As shown in FIG. 3A, the semiconductor chip 10 and the chip stacks 20 and 30 are attached on a carrier substrate 300, in accordance with some embodiments. An adhesion layer (not shown) may be used to attach the semiconductor chip 10 and the chip stacks 20 and 30 onto the carrier substrate 300. In some embodiments, the carrier substrate 300 includes a glass substrate, a ceramic substrate, a semiconductor substrate, a polymer substrate, another suitable substrate, or a combination thereof. In some embodiments, the carrier substrate 300 is a temporary substrate to support the semiconductor chip 10 and the chip stacks 20 and 30 during subsequent processes. Afterwards, the carrier substrate 300 may be removed.

Figure 3B:
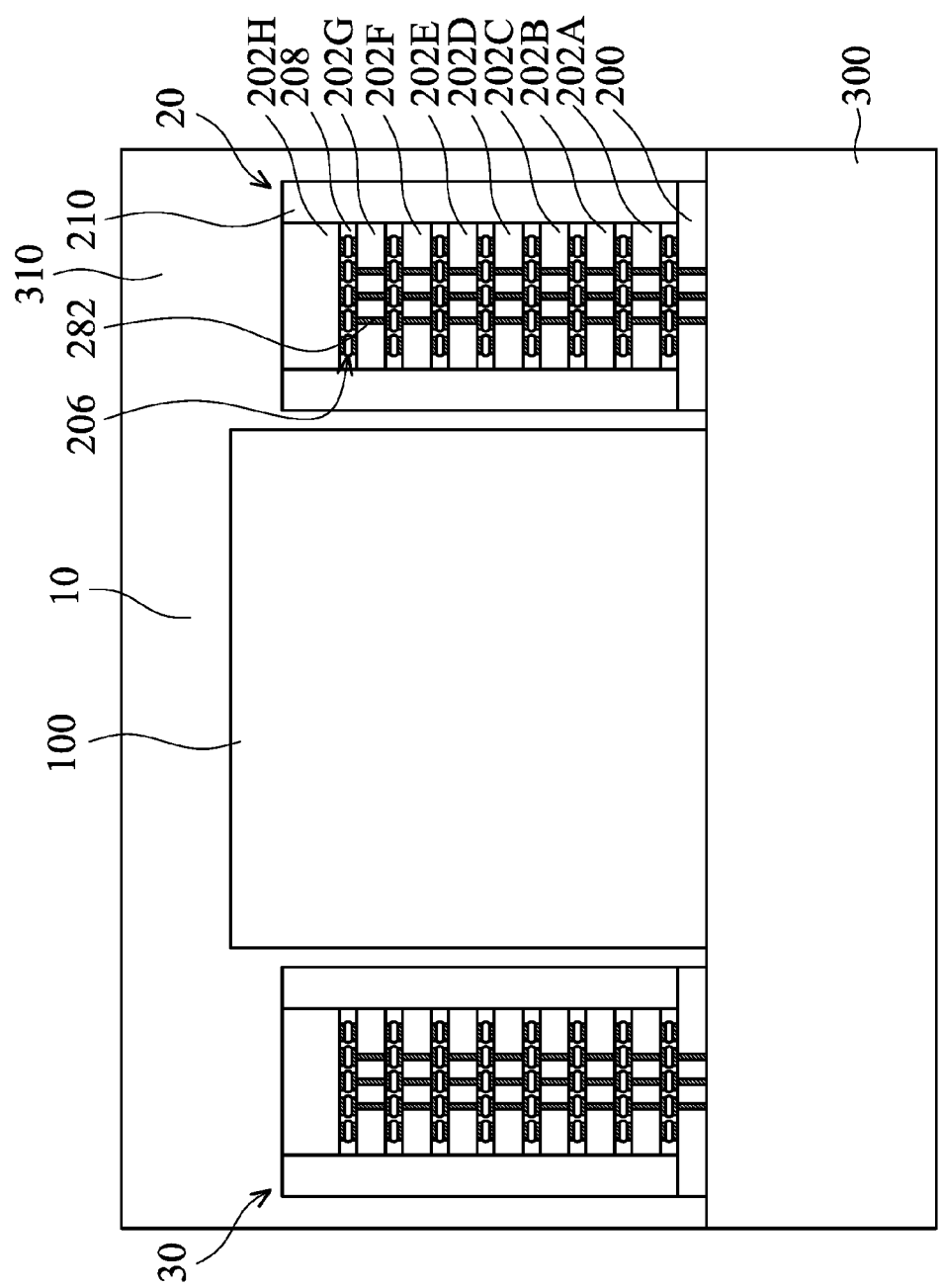

As shown in FIG. 3B, a package layer 310 is formed over the carrier substrate 300 to encapsulate the semiconductor chip 10 and the chip stacks 20 and 30, in accordance with some embodiments. In some embodiments, the package layer 310 fills gaps between the semiconductor chip 10 and the chip stack 20 or 30. In some embodiments, the package layer 310 is in direct contact with the molding compound layers 210 of the chip stacks 20 and 30.

In some embodiments, the package layer 310 includes a polymer material. In some embodiments, the package layer 310 is a molding compound layer. The molding compound layer may include an epoxy-based resin with fillers dispersed therein. The fillers may include insulating fibers, insulating particles, other suitable elements, or a combination thereof.

In some embodiments, a liquid molding compound material is applied, and a thermal operation is then applied to cure the liquid molding compound material. As a result, the liquid molding compound material is hardened and transformed into the package layer 310. In some embodiments, the thermal operation is performed at a temperature in a range from about 200 degrees C. to about 230 degrees C. The operation time of the thermal operation may be in a range from about 1 hour to about 3 hours.

Figure 3C:
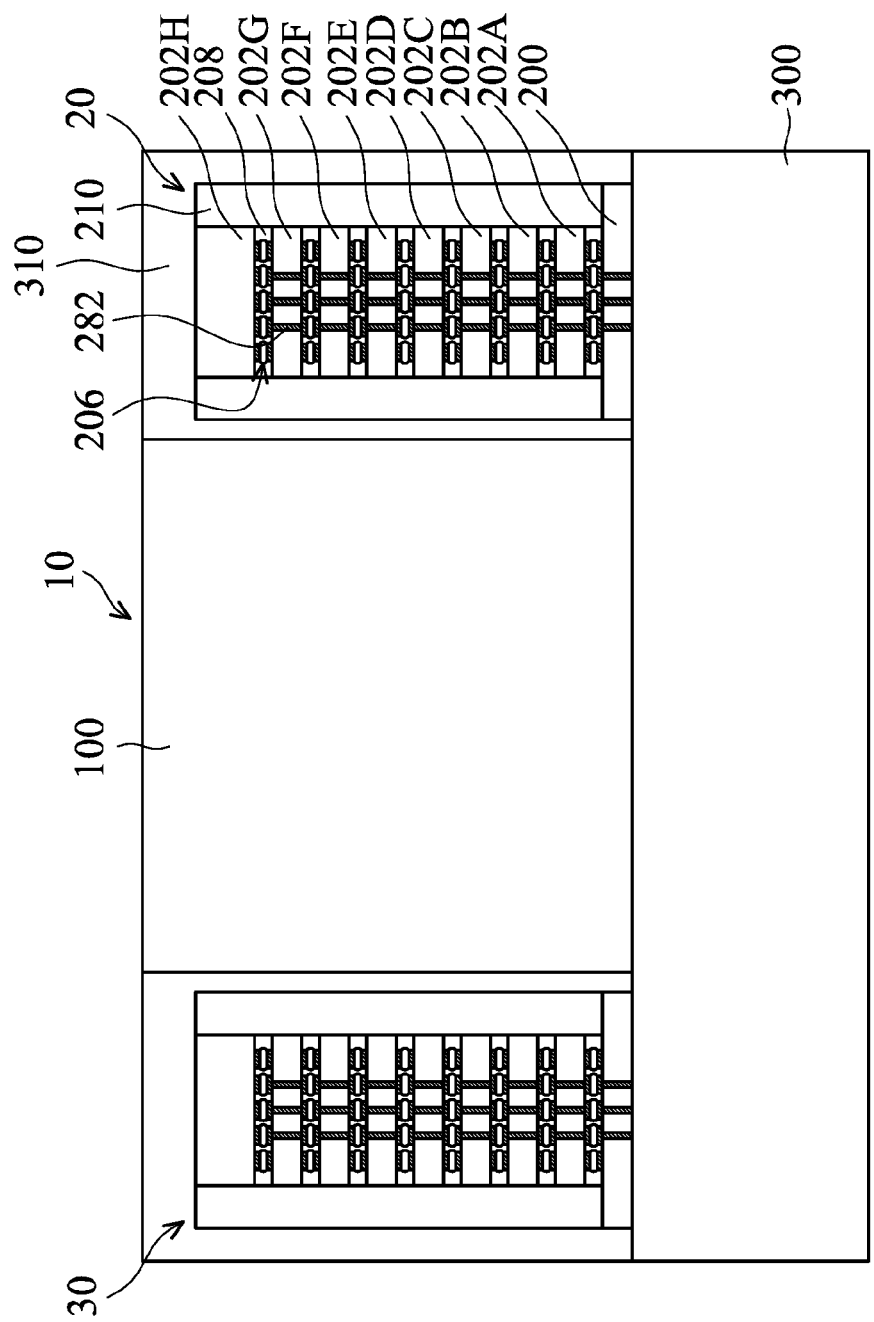

As shown in FIG. 3C, the package layer 310 is planarized so that the top surface of the semiconductor chip 10 is exposed, in accordance with some embodiments. In some embodiments, the package layer 310 is planarized using a grinding process, a chemical mechanical polishing (CMP) process, another applicable process, or a combination thereof. In some embodiments, the top surface of the chip stack 20 or 30 remains covered by the package layer 310. In some embodiments, the chip stacks 20 and 30 are protected by the package layer 310 during the planarization process. The chip stacks 20 and 30 are not ground during the planarization process. Therefore, the chip stacks 20 and 30 are prevented from being damaged during the planarization process. The quality and reliability of the chip stacks 20 and 30 are significantly improved.

In some embodiments, the package layer 310 covers the top and the sidewalls of the chip stacks 20 and 30, as shown in FIG. 3C. In some embodiments, the top surface of the semiconductor chip 10 is not covered by the package layer 310. In some embodiments, the top surface of the package layer 310 is substantially coplanar with the top surface of the semiconductor chip 10, which may facilitate subsequent processes.

Figure 3D:
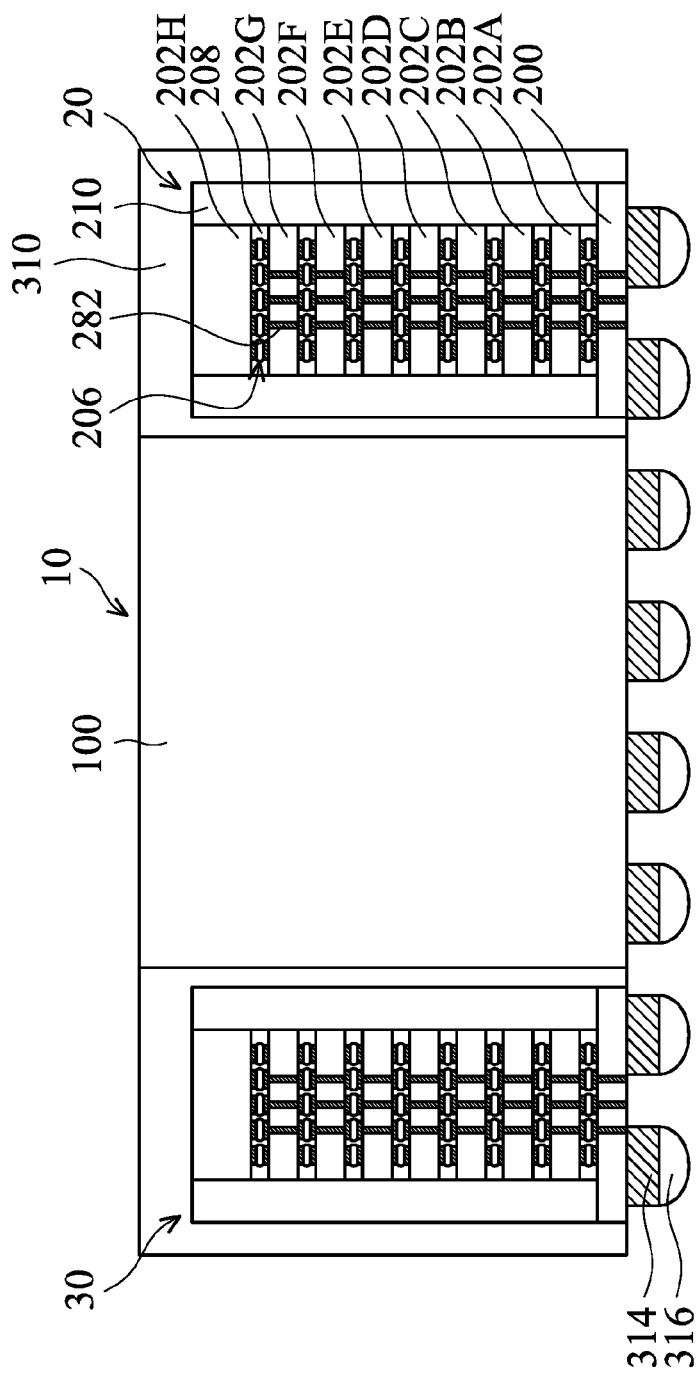

As shown in FIG. 3D, the carrier substrate 300 is removed such that the bottom surfaces of the semiconductor chip 10, the chip stacks 20 and 30, and the package layer 310 are exposed, in accordance with some embodiments. In some embodiments, the bottom surfaces of the semiconductor chip 10, the chip stacks 20 and 30, and the package layer 310 are substantially coplanar with each other.

Afterwards, conductive elements are formed over the bottom surfaces of the semiconductor chip 10 and the chip stacks 20 and 30, as shown in FIG. 3D in accordance with some embodiments. In some embodiments, the conductive elements include metal pillars 314 and solder elements 316, as shown in FIG. 1E. In some other embodiments, the conductive elements include other configurations. In some embodiments, a buffer layer (not shown) is formed to protect the conductive elements.

Figure 3E:
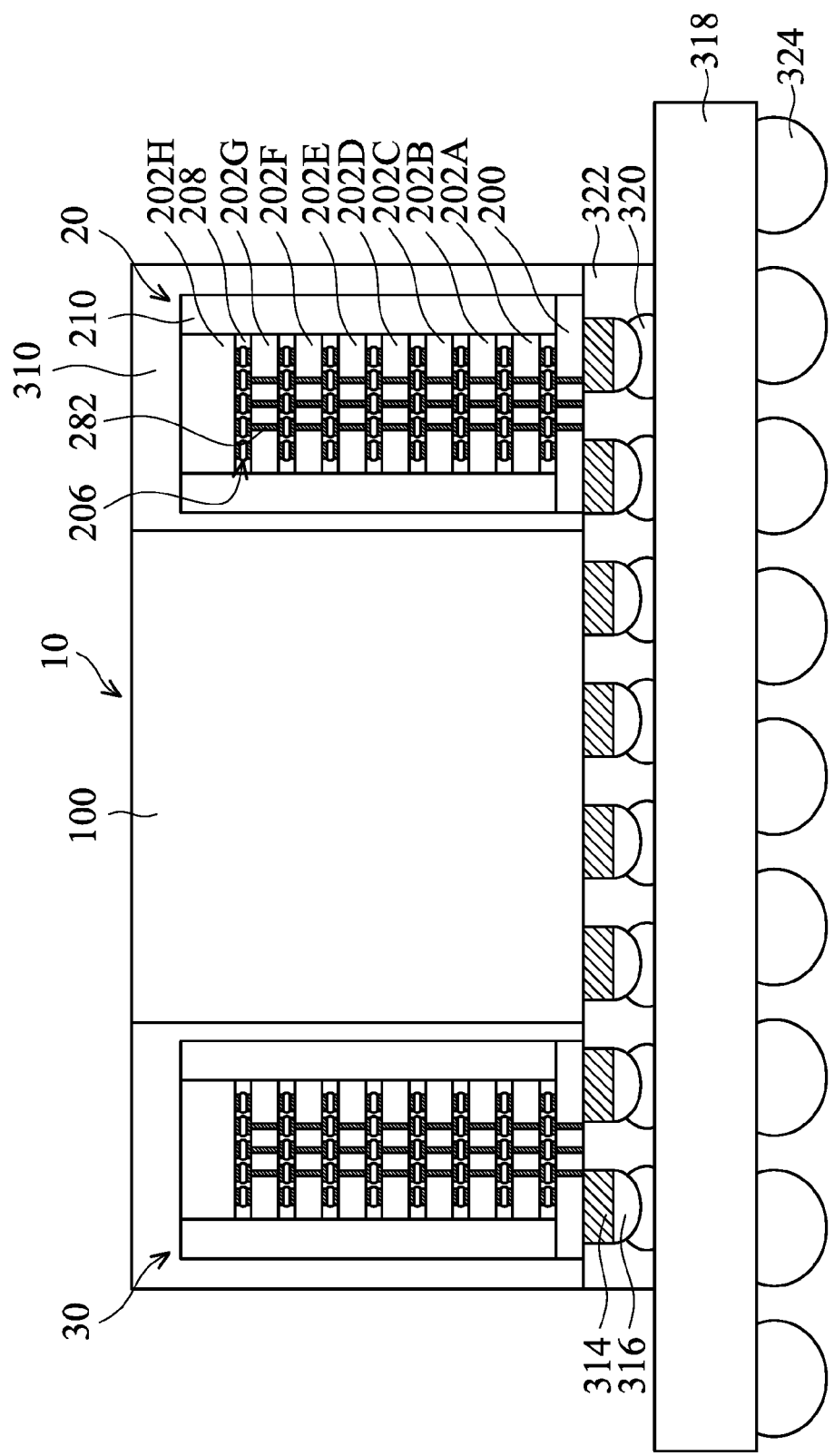

As shown in FIG. 3E, the structure shown in FIG. 3D is bonded onto a substrate 318, in accordance with some embodiments. In some embodiments, the substrate 318 is a circuit board such as a printed circuit board. In some other embodiments, the substrate 318 is a ceramic substrate. In some embodiments, conductive elements 320 and 324 are formed on opposite surfaces of the substrate 318, as shown in FIG. 3E. In some embodiments, the conductive elements 320 and 324 are solder bumps such as controlled collapse chip connection (C4) bumps and/or ball grid array (BGA) bumps. In some embodiments, the conductive elements 320 and the solder elements 316 are reflowed and bonded together, as shown in FIG. 3E.

In some embodiments, each of the conductive elements 320 is electrically connected to one of the conductive elements 324 through conductive features (not shown) formed in the substrate 318. The conductive features may include conductive lines and conductive vias. In some embodiments, an underfill layer 322 is then formed between the substrate 318 and the chips including the semiconductor chip 10 and the chip stacks 20 and 30 to protect the conductive bonding structures therebetween. In some embodiments, the package layer 310 is not in direct contact with the conductive bonding structures therebetween.

In some embodiments, due to the protection of the package layer 310, the chip stacks 20 and 30 are prevented from being damaged during the fabrication processes. For example, the stress generated from the planarization of the package layer 310 and the bonding process to the substrate 318 is buffered. The quality of the chip package is improved.

Figure 4:
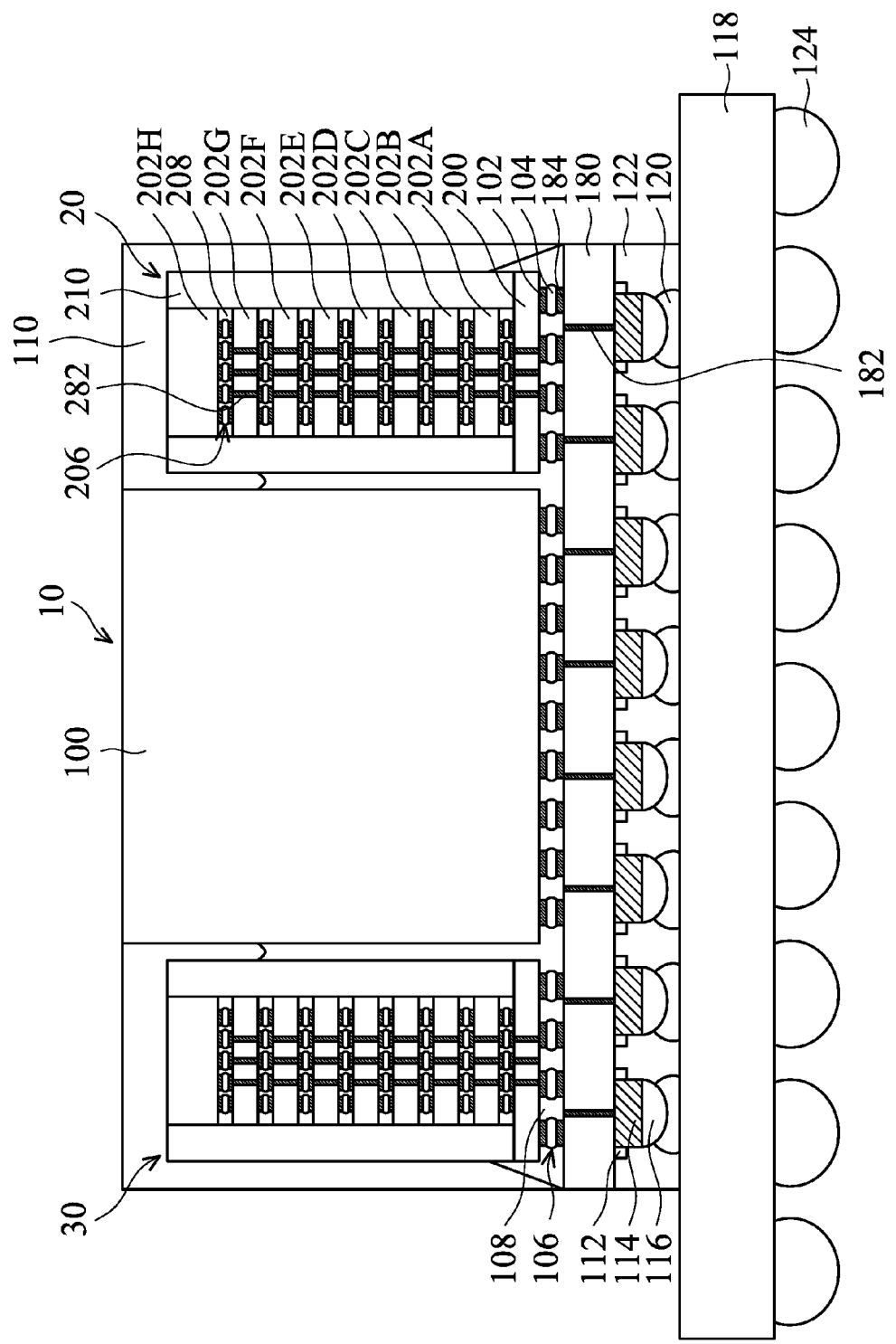
FIG. 4 is a cross-sectional view of a chip package, in accordance with some embodiments.

Many variations and/or modifications can be made to embodiments of the disclosure. FIG. 4 is a cross-sectional view of a chip package, in accordance with some embodiments. In some embodiments, the underfill layer 108 not only surrounds the conductive bonding structures 106 but further extends on sidewalls, of the semiconductor chip 10. Portions of the sidewalls of the semiconductor chip 10 are covered by the underfill layer 108. In some embodiments, the underfill layer 108 extends on the chip stacks 20 and 30. Portions of the sidewalls of the chip stacks 20 and 30 are covered by the underfill layer 108.

Figure 5:
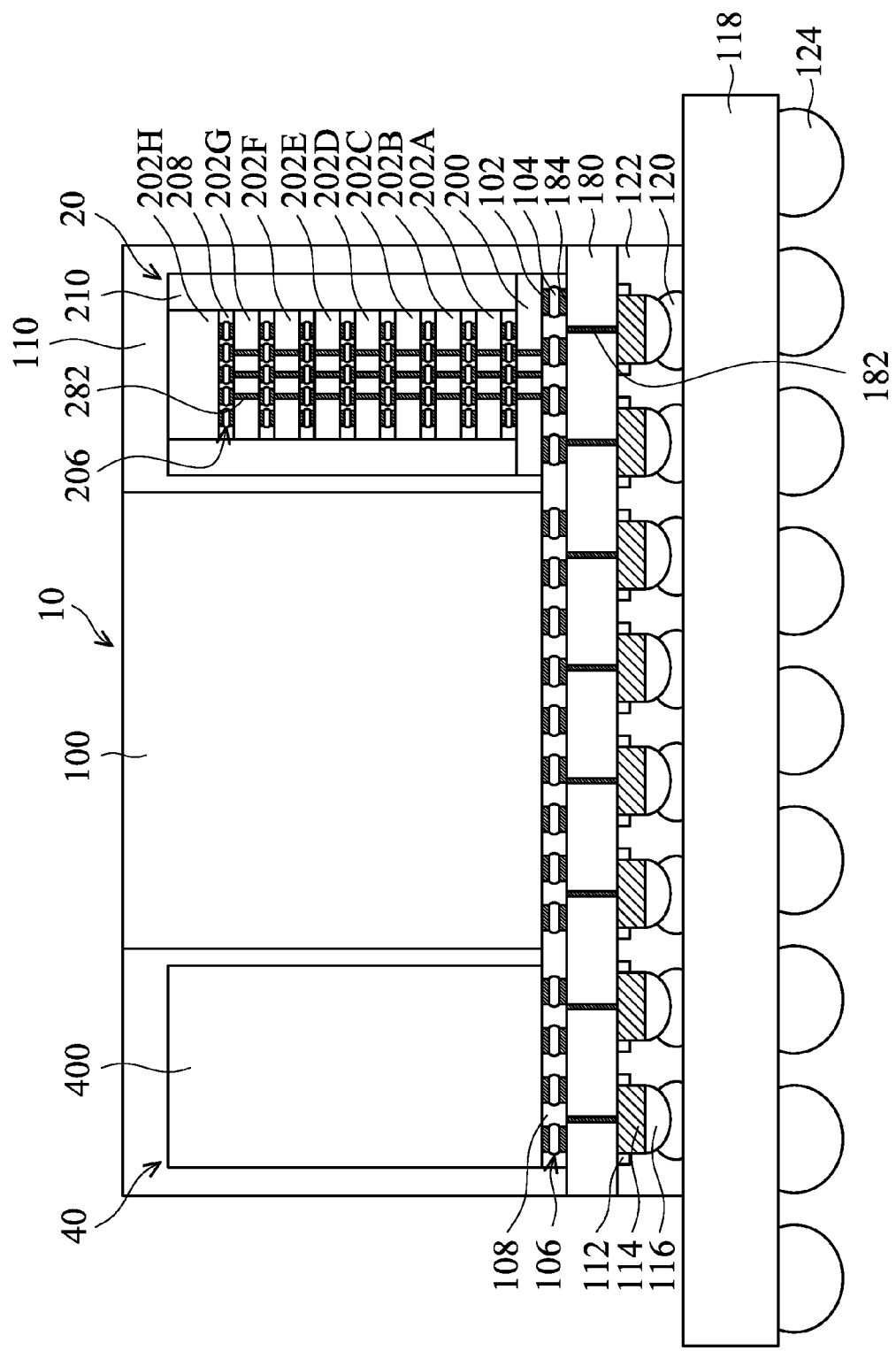
FIG. 5 is a cross-sectional view of a chip package, in accordance with some embodiments.

Many variations and/or modifications can be made to embodiments of the disclosure. FIG. 5 is a cross-sectional view of a chip package, in accordance with some embodiments. The structure shown in FIG. 5 is similar to that shown in FIG. 1F. In some embodiments, the semiconductor chip 10 is positioned between the chip stack 20 and a semiconductor chip 40. In some embodiments, the semiconductor chip 10 is higher than the chip stack 20 or the semiconductor chip 40. In some embodiments, the heights of the semiconductor chip 40 and the chip stack 20 are different from each other. In some embodiments, the semiconductor chip 40 is higher than the chip stack 20.

In some embodiments, the semiconductor chip 40 includes a semiconductor substrate 400 and an interconnection structure (not shown) formed on the semiconductor substrate 400. For example, the interconnection structure is formed on a bottom surface of the semiconductor substrate 400. The interconnection structure includes multiple interlayer dielectric layers and multiple conductive features formed in the interlayer dielectric layers. These conductive features include conductive lines, conductive vias, and conductive contacts. Some portions of the conductive features may be used as conductive pads.

In some embodiments, similar to the semiconductor substrate 100, various device elements are formed in the semiconductor substrate 400. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements.

The device elements are interconnected through the interconnection structure to form integrated circuit devices. The integrated circuit devices include logic devices, memory devices (e.g., static random access memories, SRAMs), radio frequency (RF) devices, input/output (I/O) devices, system-on-chip (SoC) devices, other applicable types of devices, or a combination thereof. In some embodiments, the semiconductor chip 40 is a system-on-chip (SoC) chip that includes multiple functions. In some embodiments, one or more of the functions of the semiconductor chips 10 and 40 are different from each other.

Embodiments of the disclosure form a chip package including a first semiconductor chip and a second semiconductor chip that may be a chip stack. The heights of the first semiconductor chip and the second semiconductor chip are different. A package layer, such as a molding compound layer, is formed to encapsulate the first semiconductor chip and the second semiconductor chip. The package layer is thinned to expose the first semiconductor chip. During the thinning process, the second semiconductor chip is protected by the package layer without being directly ground. The second semiconductor chip (or chip stack) is prevented from negatively affected due to the protection of the package layer during the thinning process. The performance and reliability of the chip package are significantly improved.

In accordance with some embodiments, a chip package is provided. The chip package includes a chip stack including a number of semiconductor dies. The chip package also includes a semiconductor chip, and the semiconductor chip is higher than the chip stack. The chip package further includes a package layer covering a top and sidewalls of the chip stack and sidewalls of the semiconductor chip.

In accordance with some embodiments, a chip package is provided. The chip package includes a first semiconductor chip and a second semiconductor chip. The chip package also includes a molding compound layer surrounding the first semiconductor chip and the second semiconductor chip. The molding compound layer covers a top surface of the first semiconductor chip, and a top surface of the molding compound layer is substantially coplanar with a top surface of the second semiconductor chip.

In accordance with some embodiments, a method for forming a chip package is provided. The method includes bonding a first semiconductor chip and a second semiconductor chip over a substrate. The method also includes forming a package layer over the substrate to encapsulate the first semiconductor chip and the second semiconductor chip. The method further includes planarizing the package layer so that a top surface of the second semiconductor chip is exposed, and a top surface of the first semiconductor chip is covered by the package layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
a chip stack including a plurality of semiconductor dies;
a semiconductor chip, wherein the semiconductor chip is higher than the chip stack; and
a package layer overfilling a gap between the chip stack and the semiconductor chip, the package layer covering a top and sidewalls of the chip stack and sidewalls of the semiconductor chip.

2. The chip package as claimed in claim 1, wherein a top surface of the semiconductor chip is not covered by the package layer.

3. The chip package as claimed in claim 1, further comprising a substrate, wherein the chip stack and the semiconductor chip are bonded on the substrate through conductive bonding structures.

4. The chip package as claimed in claim 3, wherein the substrate is a semiconductor substrate.

5. The chip package as claimed in claim 4, further comprising a conductive feature penetrating through the substrate and electrically connected to one of the conductive bonding structures.

6. The chip package as claimed in claim 3, wherein the package layer surrounds and is in direct contact with the conductive bonding structures.

7. The chip package as claimed in claim 3, further comprising an underfill layer surrounding and in direct contact with the conductive bonding structures, wherein the underfill layer is between the substrate and the package layer.

8. The chip package as claimed in claim 7, wherein the underfill layer is in direct contact with the package layer.

9. The chip package as claimed in claim 1, wherein the chip stack comprises a plurality of memory dies.

10. The chip package as claimed in claim 1, wherein a top surface of the package layer is substantially coplanar with a top surface of the semiconductor chip.

11. The chip package as claimed in claim 1, wherein the chip stack comprises a molding compound layer surrounding the plurality of semiconductor dies.

12. A chip package, comprising:
a first semiconductor chip;
a second semiconductor chip; and
a molding compound layer surrounding the first semiconductor chip and the second semiconductor chip, wherein the molding compound layer covers a top surface of the first semiconductor chip, and a top surface of the molding compound layer is substantially coplanar with a top surface of the second semiconductor chip.

13. The chip package as claimed in claim 12, wherein the second semiconductor chip is higher than the first semiconductor chip.

14. The chip package as claimed in claim 12, further comprising a substrate, wherein the first semiconductor chip and the second semiconductor chip are bonded on the substrate through conductive bonding structures.

15. The chip package as claimed in claim 14, further comprising a conductive feature penetrating through the substrate and electrically connected to one of the conductive bonding structures.

16. The chip package as claimed in claim 14, wherein the molding compound layer surrounds and is in direct contact with the conductive bonding structures.

17. A method for forming a chip package, comprising:
- bonding a first semiconductor chip and a second semiconductor chip over a substrate;
- forming a package layer over the substrate to encapsulate the first semiconductor chip and the second semiconductor chip; and
- planarizing the package layer so that a top surface of the second semiconductor chip is exposed, and a top surface of the first semiconductor chip is covered by the package layer.

18. The method for forming a chip package as claimed in claim 17, wherein the first semiconductor chip is not ground during the planarization process.

19. The method for forming a chip package as claimed in claim 17, wherein the first semiconductor chip and the second semiconductor chip are bonded onto the substrate through a plurality of conductive bonding structures.

20. The method for forming a chip package as claimed in claim 19, further comprising forming an underfill layer to surround the conductive bonding structures before the formation of the package layer.

* * * * *